United States Patent
Aratani et al.

(10) Patent No.: US 7,772,029 B2
(45) Date of Patent: Aug. 10, 2010

(54) MEMORY ELEMENT AND MEMORY DEVICE COMPRISING MEMORY LAYER POSITIONED BETWEEN FIRST AND SECOND ELECTRODES

(75) Inventors: Katsuhisa Aratani, Chiba (JP);
Tomohito Tsushima, Kanagawa (JP);
Akira Kouchiyama, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 11/998,917

(22) Filed: Dec. 3, 2007

(65) Prior Publication Data
US 2008/0089112 A1    Apr. 17, 2008

Related U.S. Application Data

(62) Division of application No. 11/280,561, filed on Nov. 15, 2005.

(30) Foreign Application Priority Data
Nov. 15, 2004   (JP)   ............... 2004-330809

(51) Int. Cl.
*H01L 29/02*   (2006.01)
(52) U.S. Cl. ................. 438/102; 438/103; 257/2; 257/3; 257/4; 257/5
(58) Field of Classification Search ........... 257/1–5; 438/102–103
See application file for complete search history.

(56) References Cited
U.S. PATENT DOCUMENTS
4,719,594 A   1/1988   Young et al.
5,761,115 A   6/1998   Kozicki et al.

(Continued)

FOREIGN PATENT DOCUMENTS
JP   2001-502848 A   2/2001

(Continued)

OTHER PUBLICATIONS

Ramesh et al. (Ramesh, et al., "Electrical Switching in germanium telluride glasses doped with Cu and Ag", Applied Physics A, vol. 69 (1999) pp. 421-425).*

(Continued)

*Primary Examiner*—Bradley K Smith
*Assistant Examiner*—Jami M Valentine
(74) *Attorney, Agent, or Firm*—Wolf, Greenfield & Sacks, P.C.

(57) ABSTRACT

A memory element 10 includes a memory layer 4 positioned between a first electrode 2 and a second electrode 6, in which an element selected from Cu, Ag, and Zn is contained in the memory layer 4 or in a layer 3 in contact with the memory layer 4, a resistance of the memory element 10 is changed by a voltage applied to the memory element 10 to perform recording of information, and in an erasing process of changing from a recorded state of low resistance value of the memory element 10 to an erased state of high resistance value of the memory element 10, a fluctuation, which is caused by an increase of the voltage applied to the memory element 10, of the resistance value of the memory element 10 at the end of the erasing process is within ten times at a maximum.

4 Claims, 5 Drawing Sheets

U.S. PATENT DOCUMENTS

| | | | |
|---|---|---|---|
| 5,825,046 | A | 10/1998 | Czubatyj et al. |
| 5,846,625 | A | 12/1998 | Terao et al. |
| 6,087,674 | A | 7/2000 | Ovshinsky et al. |
| 6,418,049 | B1 | 7/2002 | Kozicki et al. |
| 6,788,864 | B2 | 9/2004 | Ahmad et al. |
| 6,977,835 | B2 | 12/2005 | Kang |
| 7,129,133 | B1 | 10/2006 | Avanzino et al. |
| 2002/0168820 | A1* | 11/2002 | Kozicki et al. ............... 438/259 |
| 2003/0048519 | A1 | 3/2003 | Kozicki |
| 2003/0234449 | A1 | 12/2003 | Aratani et al. |

FOREIGN PATENT DOCUMENTS

| | | |
|---|---|---|
| JP | 2001-525606 A | 12/2001 |
| JP | 2002-536840 A | 10/2002 |
| JP | 2004-288843 A | 10/2004 |
| JP | 2005-197634 A | 7/2005 |
| WO | WO 03/094227 A1 | 11/2003 |
| WO | WO 2004/084306 A1 | 9/2004 |

OTHER PUBLICATIONS

Chatterjee et al., ("A PC-based system for studying current-controlled electrical switching in solids", Review of Scientific Instrumentation, 65 (7), Jul. 1994, pp. 2382-2387).*

Phys. Rev. Lett. 21, (1968) p. 1450 by S.R. Ovshinsky is cited as an example of a phase change memory device.

* cited by examiner

MEMORY ELEMENT AND MEMORY DEVICE COMPRISING MEMORY LAYER POSITIONED BETWEEN FIRST AND SECOND ELECTRODES

CROSS REFERENCES TO RELATED APPLICATIONS

This application is a Divisional of U.S. application Ser. No. 11/280,561 filed on Nov. 15, 2005, which, in turn, claims priority to Japanese application No. JP2004-330809 filed Nov. 15, 2004, both of which are herein incorporated by reference in their entirety.

BACKGROUND OF THE INVENTION

1. Field of the Invention

The present invention relates to a memory element in which recording of information can be performed and a memory device including the memory element.

2. Description of the Related Art

A DRAM operating at high-speed and having a high density is widely used as a random access memory in an information processing device such as a computer.

However, since a manufacturing process of the DRAM is complicated, manufacturing costs are high in comparison to a typical logic circuit LSI and signal processing which are used in an electronic device. is necessary to perform frequently a refreshing operation, specifically, an operation in which written information (data) is read out, again amplified, and rewritten.

Then, an FeRAM (ferroelectric random access memory), MRAM (magnetic random access memory), and the like, for example are proposed as a nonvolatile memory in which information does not disappear even when the power is shut off.

In case of those memories, the written information can be retained for a long time even if the power is not supplied.

Further, in case of those memories, a refreshing operation becomes not necessary with the memory made nonvolatile, and it is assumed that the power consumption can be reduced to that extent.

However, in the above-described nonvolatile memory, it becomes difficult to secure a characteristic as a memory element due to a miniaturization of a memory element that constitutes each memory cell.

Therefore, it is difficult to miniaturize the element to the limit of a design rule and a limit on a manufacturing process.

Hereupon, a memory element of a new type has been proposed as a memory having a suitable structure for miniaturization.

This memory element has a structure in which an ion conductor containing a certain metal is positioned between two electrodes.

Further, since the metal contained in the ion conductor is made to be contained in one of the two electrodes, the metal contained in the electrode is diffused as an ion in the ion conductor when a voltage is applied between the two electrodes, and thereby an electric characteristic such as a resistance value or capacitance of the ion conductor changes.

A memory device can be made by using this characteristic (for example, refer to Patent reference 1 and Non-patent reference 1).

Specifically, the ion conductor is made of a solid solution of a chalcogenide and metal, further specifically, made of a material in which Cu, Ag, and Zn are solidly solved into AsS, GeS, and GeSe, and one of the two electrodes contains Cu, Ag, and Zn (refer to the-above described Patent reference 1).

Furthermore, various kinds of nonvolatile memories using a crystal oxide material have also been proposed, and a memory in a device, for example, having a structure in which a Cr-doped $SrZrO_3$ crystal material is positioned between a lower electrode made of $SrRuO_3$ or Pt and an upper electrode made of Au or Pt is reported, where a resistance is changed reversibly by applying a voltage of a different polarity (refer to the Non-patent reference 2). However, details of the principle and the like are not clear.

[Patent reference 1] Japanese Published Patent Application No. 2002-536840

[Non-patent reference 1] Nikkei electronics, Jan. 20, 2003 issue (page 104)

[Non-patent reference 2] A. Beck et al., Appl. Phys. Lett., 77, (year 2000), p. 139

SUMMARY OF THE INVENTION

However, as described above, the memory element having the structure in which Cu, Ag, and Zn are contained either in the upper electrode or in the lower electrode and the Ges or GeSe amorphous chalcogenide material is positioned between the electrodes, and the memory element using the crystal oxide material have a considerable on-off ratio of a resistance, specifically, a ratio of a resistance value in a low resistance state (on-resistance) to a resistance value in a high resistance state (off-resistance) is extremely large, and the ratio has four or more digits, for example.

Further, when a short voltage pulse is applied to such memory element whose on-off ratio of the resistance is considerably large, there is a case in which an intermediate value of those resistance values is used as the resistance value.

When the resistance value of the memory element is the intermediate value, there is not only a probability of decreasing in a margin for data identification at the time of readout, but also a difficulty that recording and erasure of information can not be performed stably due to fluctuation of a threshold voltage at the recording and erasure.

The present invention addresses the above-identified and other problems associated with conventional methods and apparatuses, and provides a memory element having a structure in which recording and erasure of information can be performed stably and a memory device using the memory element.

A memory element according to an embodiment of the present invention includes a memory layer positioned between a first electrode and a second electrode, in which an element selected from Cu, Ag, and Zn is contained in the memory layer or in a layer in contact with the memory layer, a resistance of the memory element is changed by a voltage applied to the memory element to perform recording of information, and when a state of high resistance value of the memory element is defined as an erased state and a state of low resistance value is defined as a recorded state, in a process of changing from the recorded state to the erased state, a fluctuation, which is caused by an increase of the voltage applied to the memory element, of the resistance value of the memory element at the end of the process is within ten times at a maximum.

Specifically, such structures are conceivable in which an element selected from Cu, Ag, and Zn is contained in a layer in contact with the memory layer, is contained in the memory layer, and is contained respectively in the memory layer and in a layer in contact with the memory layer.

According to the structure of the above-described embodiment of the memory element of the present invention, since the memory element includes the memory layer positioned between the first electrode and the second electrode, and since an element selected from Cu, Ag, and Zn is contained in the memory layer or in the layer in contact with the memory layer, information can be recorded by using the change in a resistance state of the memory layer.

Specifically, when a voltage is applied to the memory element by applying, for example, a positive potential to the electrode of one side, the resistance value of the memory layer becomes low, because Cu, Ag, and Zn are ionized and diffused in the memory layer and the diffused ion couples with an electron to deposit in a portion of the electrode of the other side or stays in the memory layer to form an impurity level of an insulation film, and thereby the recording of information can be performed.

Also, when a negative voltage is applied to the memory element in this state by applying a negative potential to the electrode of one side, the memory layer returns to the state of original high resistance value and the resistance value of the memory element becomes high, because Cu. Ag, and Zn that have been deposited on the electrode of the other side are again ionized and return to an original state, and thereby the erasure of recorded information can be performed.

Specifically, when the voltage is applied to the memory element, the resistance of the memory element is changed to perform the recording of information.

Further, when a state of high resistance value of the memory element is defined as an erased state and a state of low resistance value is defined as a recorded state, in a process of changing from the recorded state to the erased state (hereinafter, referred to as an erasing process), a fluctuation, which is caused by an increase of the voltage applied to the memory element, of the resistance value of the memory element at the end of the process is within ten times at a maximum and thereby the fluctuation of the resistance value of the memory element at the end of the erasing process due to the fluctuation of the voltage applied to the memory element can be controlled small. Accordingly, a fluctuation of resistance-voltage characteristic in the erased state is controlled and a fluctuation of a threshold voltage in the next process of changing from the erased state to the recorded state (hereinafter, referred to as a recording process) can be controlled, and therefore recording and erasure of information can be performed repeatedly and stably.

A memory device according to an embodiment of the present invention includes: a memory element having a memory layer positioned between a first electrode and a second electrode, in which an element selected from Cu, Ag, and Zn is contained in the memory layer or in a layer in contact with the memory layer, a resistance of the memory element is changed by a voltage applied to the memory element to perform recording of information, and when a state of high resistance value of the memory element is defined as an erased state and a state of low resistance value is defined as a recorded state, in a process of changing from the recorded state to the erased state, a fluctuation, which is caused by an increase of the voltage applied to the memory element, of the resistance value of the memory element at the end of the process is within ten times at a maximum; a wiring connected on the side of the first electrode; and a wiring connected on the side of second electrode; wherein the memory elements are disposed in large numbers.

According to the structure of the above-described embodiment of the memory device of the present invention, since the memory device includes the above-described memory element of the present invention, the wiring connected on the side of the first electrode, and the wiring connected on the side of the second electrode, and since the memory elements are disposed in large numbers in the memory device, a voltage is applied to the memory element from the wiring to make an electric current flow and so the recording of information and erasure of information can be performed.

In the above-described memory element and memory device according to the embodiments of the present invention, an element selected from Te, S, and Se can be contained in a memory layer or in a layer in contact with the memory layer in the memory element.

With the memory element having such a structure, since an element (chalcogen element) selected from Te, S, and Se has a property of facilitating the ionization of Cu, Ag, and Zn, the recording can be performed even when a comparatively low voltage is applied.

In the above-described memory element and memory device according to the embodiment of the present invention, the memory element may have a characteristic that the larger the voltage applied to the memory element is, the more the resistance value of the erased state of the memory element decreases.

With the memory element having such a structure, the fluctuation of the resistance value of the memory element at the end of the erasing process due to the fluctuation of the voltage applied to the memory element can be controlled to be small by also having the characteristic that the larger the voltage applied to the memory element is, the more the resistance value of the erased state of the memory element decreases, and thereby the fluctuation of the threshold value of the recording process described above can be controlled.

According to the embodiment of the memory element of the present invention, recording and erasure of information can be performed repeatedly and stably with respect to the memory element.

In addition, the erasing process can be completed almost surely even by a comparatively small voltage applied, and the recording and erasure of information can be performed with a comparatively small voltage and short voltage pulse.

Hence, it is possible to reduce the power consumption by decreasing the voltage applied to the memory element and to perform the recording and erasure in a short period of time.

Further, since the recording of information is performed by using a change in the resistance value of the memory element, there is such an advantage that the recording of information and retention of recorded information become easy even when the memory element is further miniaturized.

Hence, according to the present invention, a memory device can be obtained in which the recording and erasure of information can be performed stably, the power consumption is reduced, and a high-speed operation is performed.

Further, it is possible to obtain integration in larger scale (higher density) and size reduction of the memory device.

DESCRIPTION OF THE PREFERRED EMBODIMENTS

Figure 1:
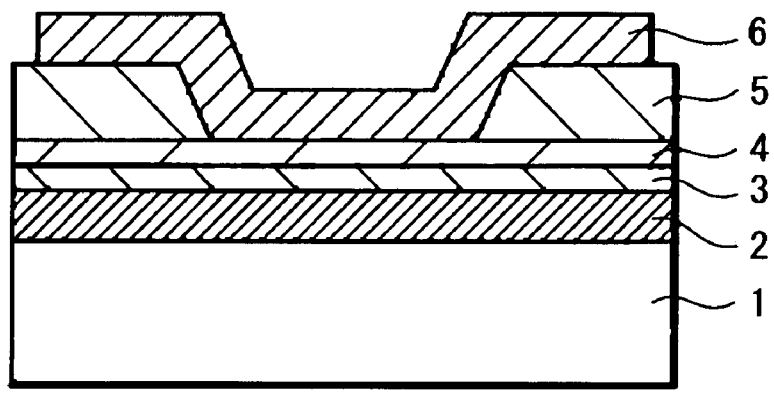
FIG. 1 is a schematic constitutional diagram (cross-sectional diagram) of a memory element according to an embodiment of the present invention.

FIG. 1 shows a schematic constitutional diagram (cross-sectional diagram) of a memory element as an embodiment of the present invention.

A memory element 10 includes: a substrate 1 of high electrical conductivity, which is a silicon substrate 1 doped with concentrated impurity of p-type (of $P^{++}$), for example; a lower electrode 2 formed thereon; an ion source layer 3 containing an element from among Cu, Ag, Zn, and Te, S, Se formed on the lower electrode 2; a memory layer 4 formed thereon, and an upper electrode 6 formed to connect to the memory layer 4 through an opening made in a insulation layer 5 formed on the memory layer 4.

As the lower electrode 2, a wiring material used for a semiconductor process such as TiW, Ti, W, Cu, Al, Mo, Ta, WN, TaN, and silicide, for example, can be used.

When a TiW film is used for this lower electrode 2, for example, the film thickness may be made into a range from 10 nm to 100 nm, for example.

Further, the ion source layer 3 can be formed of a film having a composition in which Cu, Ag, and Zn are added to GeSbTe, GeTe, GeSe, GeS, SiGeTe, SiGeSbTe and the like that contain a chalcogenide element of Te, Se, and S, an Ag film, an Ag alloy film, a Cu film, a Cu alloy film, a Zn film, a Zn alloy film, and the like, for example.

Note that thermo-stability can be improved by adding Ge, a rare-earth element and the like to this ion source layer 3 according to the necessity.

When a GeTeCu film is used for the ion source layer 3, for example, a film thickness may be made into 5 nm to 50 nm, for example. Also, when Cu, Ag, and Zn are used, for example, a film thickness may be made into 2 nm to 30 nm, for example.

The memory layer 4 can be formed using a material having a comparatively high electrical resistivity such as oxide and nitride, for example.

As the oxide, SiO2, transition metal oxide, oxide of rare-earth element and the like can be used, for example.

Further, silicon nitride SiN, nitride of rare-earth element and the like, for example, can be used as the nitride.

This memory layer 4 is formed into a film having the thickness of approximately 0.5 nm to 10 nm.

Thus, with the film thickness of the memory layer 4 being made thin, a current can flow in the memory layer 4 made of the oxide and nitride that are typical insulation materials.

The memory layer 4 made of the above-described materials has a characteristic that an impedance (resistance value) changes when applying a voltage pulse or current pulse.

Further, this memory layer 4 has a sufficiently larger change of the resistance value than the other layers. Therefore, the change of the resistance value of the whole memory element 10 is mainly caused by the change in the memory layer 4.

Accordingly, it is possible to perform the recording of information in the memory element 10 by using the change of the resistance value of the memory layer 4.

As the insulation layer 5, it is possible to use, for example, a hard-cured photo-resist, $SiO_2$ and $Si_3N_4$ that are used typically in a semiconductor device, and other materials that are an inorganic material such as SiON, SiOF, $Al_2O_3$, $Ta_2O_5$, $HfO_2$, and $ZrO_2$, for example, a fluorine-based organic material, an aromatic-based organic material and the like.

Similarly to the lower electrode 2, a typical semiconductor wiring material is used for the upper electrode 6.

Note that the memory layer 4 is formed on the ion source layer 3 in the memory element 10 shown in FIG. 1, however, the ion source layer 3 may be formed on the memory layer 4.

Further, the upper electrode 6 may be formed by laminating an electrode layer directly on the memory layer 4 and by patterning into a predetermined pattern.

In the memory element 10 according to this embodiment, information can be stored by operation as follows.

First, a voltage is applied to the memory element 10 so that the side of lower electrode 2 in contact with the ion source layer 3 in which Cu, Ag, and Zn are contained becomes positive and the side of upper electrode 6 becomes negative.

Here, the voltage applied to the memory element 10 at this time is defined as a negative voltage (−), and hereinafter an explanation is made by defining similarly.

When applying the negative voltage to the memory element 10, Cu, Ag, and Zn are ionized and diffused from the ion source layer 3 into the memory layer 4 and the diffused ion couples with an electron to deposit on the side of upper electrode 6 or remains in the memory layer 4 in a diffused state.

Then, a current path containing a large amount of Cu, Ag, and Zn is formed in the memory layer 4, or the resistance value of the memory layer 4 becomes low due to defects caused by Cu, Ag, and Zn formed in large numbers in the memory layer 4. Since a resistance value of each layer other than the memory layer 4 is originally low in comparison with the resistance value of the memory layer 4 before recording, the resistance value of the whole memory element 10 can also be lowered by lowering the resistance value of the memory layer 4.

After that, when the voltage applied to the memory element 10 is eliminated by removing the negative voltage, the memory element 10 is kept in a state where the resistance value is lowered. Hence, information can be recorded.

Further, in a memory device in which the recording of information is performed repeatedly, the erasing process of returning the memory element 10 to the state of high resistance value is necessary.

In this erasing process, a positive voltage (+) is applied to the memory element 10 so that the side of lower electrode 2 becomes negative and the side of upper electrode 6 becomes positive.

When applying the positive voltage to the memory element 10, Cu, Ag, and Zn constituting the current path or impurity level formed in the memory layer 4 are ionized and move in the memory layer 4 to return to the side of ion source layer 3.

Then, the current path or defect caused by Cu, Ag, and Zn disappears in the memory layer 4, and the resistance value of the memory layer 4 becomes high. Since the resistance value of each layer other than the memory layer 4 is originally low, the resistance value of the whole memory element 10 can also be raised by raising the resistance value of the memory layer 4.

After that, when the voltage applied to the memory element 10 is eliminated by removing the positive voltage, the memory element 10 is kept in a state where the resistance value is raised. Accordingly, it becomes possible to erase the recorded information.

By repeating such processes, the recording of information (writing) and the erasure of recorded information can be performed repeatedly in the memory element 10.

Further, when the state of high resistance value is made to correspond to information of "0" and the state of low resistance value is made to correspond to information of "1", respectively, for example, it is possible to change from "0" to "1" in the recording process of information by applying the negative voltage and to change from "1" to "0" in the erasing process of information by applying the positive voltage.

Here, when the resistance value of the memory element 10 becomes an intermediate value, the stability and repeatability may not be obtained sufficiently in each of recording and erasure processes of information due to a fluctuation of a threshold voltage.

A phenomenon occurring at this time can be explained as follows.

Although it is explained in the above-described operation of the memory element 10 that the ions injected into the memory layer 4 from the ion source layer 3 again return to the ion source layer 3 in the erasing process, in actuality not all the ions necessarily return to the original position, and there is a case in which part of the ions does not return as far as the original position and remains in the memory layer 4 depending on a fluctuation and the like of an amplitude (voltage value) and pulse width of an erasing voltage pulse.

Further, when a state of atom and lattice of the memory layer 4 is changed by inflow of the ion in the recording process and a lattice defect is generated, for example, the lattice defect is repaired with an oxidation reaction, for example, by further applying the erasure voltage after the ion returns to the ion source layer 3 in the erasing process. In this case, the resistance value after the erasing process (of high resistance state) also becomes fluctuated due to the fluctuation of the amplitude and pulse width of the erasure pulse voltage.

In those cases, the threshold voltage of the recording fluctuates in the next recording process after the erasing process.

Specifically, since the memory layer 4 is in a state where a part of the ion paths is already formed when a part of the ions remains in the memory layer 4, a large volume of ions are easily injected into the memory layer 4 from the ion source layer 3 by applying a comparatively low recording voltage.

In addition, the recording is also performed similarly by applying a comparatively low recording voltage, when a large volume of lattice defects exist in the memory layer 4.

Thus, since the recording is performed by applying the comparatively low voltage, the threshold voltage of the recording becomes low.

On the other hand, when the ions completely return to the ion source layer 3, and when the lattice defect of the memory layer 4 is restored into the state before recording (for example, an initial state), the recording may not be performed without a comparatively high recording voltage being applied, because it is necessary to form again a path for the move of the ion and to form a lattice defect.

Thus, since the recording is performed by applying the comparatively high recording voltage, the threshold voltage of the recording increases.

Therefore, the threshold voltage of the next recording process is determined depending on a position where the ion has returned when the ion moves from the memory layer 4 to the ion source layer 3 in the erasing process, and the threshold voltage of the next recording process fluctuates in accordance with a change in a state of the return of the ion.

Hereupon, in the memory element 10 of this embodiment, a voltage-resistance characteristic of the memory element 10 is predetermined in particular in order to control the fluctuation of the threshold voltage in the recording process.

Specifically, the memory element 10 is formed such that the fluctuation (increase) of the resistance value due to the increase of the applied voltage is within ten times at a maximum with respect to the resistance value of the memory element 10 at the end of the erasing process of shifting the resistance value of the memory element 10 from the recorded state to the erased state.

Further, a material and film thickness of each layer of the memory element 10 are selected to satisfy this characteristic.

Since the material and film thickness of the memory layer 4 largely affect the change of the resistance value of the memory element 10, a selection is mainly made with respect to the material and film thickness of the memory layer 4.

The resistance value of the memory layer 4 can be adjusted by an oxygen density, film thickness, area, and further an addition of an impurity material, for example.

Specifically, the film thickness of the memory layer 4 may be made thin, for example.

Further, an action and effectiveness described below can be obtained by making the film thickness of the memory layer 4 thin.

Since the ion returns reliably as far as the ion source layer 3 in the erasing process when making the film thickness of the memory layer 4 thin, the increase (fluctuation) of the resistance value of the memory element 10 at the end of the process due to the increase of the applied voltage becomes almost constant and within ten times at most. Depending on the film thickness of the memory layer 4, the increase of the resistance value at the end of the erasing process can be brought into almost none even if the applied voltage increases.

Thus, by controlling the increase of the resistance value of the memory element 10 at the end of the erasing process due to the increase of applied voltage, the threshold voltage of the next recording process can be made almost constant.

In addition, since the ion returns to the ion source layer 3 in a short period of time, it becomes possible to perform the recording and erasure stably even with a short voltage pulse, and recording and erasure can be performed at a high speed.

Further, since the path for the ion to move can easily be formed, the recording can be performed by a comparatively low threshold voltage.

Here, when the memory layer 4 is made thin, the resistance value of the memory element 10 is also reduced since the resistance value of the memory layer 4 is reduced.

With respect to the above-described resistance value of the memory element 10 at the end of the erasing process, a range of the film thickness of the memory layer 4 to satisfy the condition that the fluctuation (increase) of the resistance value due to the increase of the applied voltage is within ten times at a maximum changes depending on a kind of the material (insulation material and the like) that is used for the memory layer 4.

When GdGe oxide, for example, is used as the material of the memory layer 4, it is desirable that the film thickness of the memory layer 4 is made into 3 nm or less as explained in an experiment described later on.

Further, with the memory element 10 having a structure in which the resistance value in the state of high resistance (erased state) has a voltage dependence and the resistance at the time of erasure decreases along with the increase of the erasure voltage, there is also effectiveness of controlling the fluctuation of the threshold voltage in the recording process.

Figure 2:
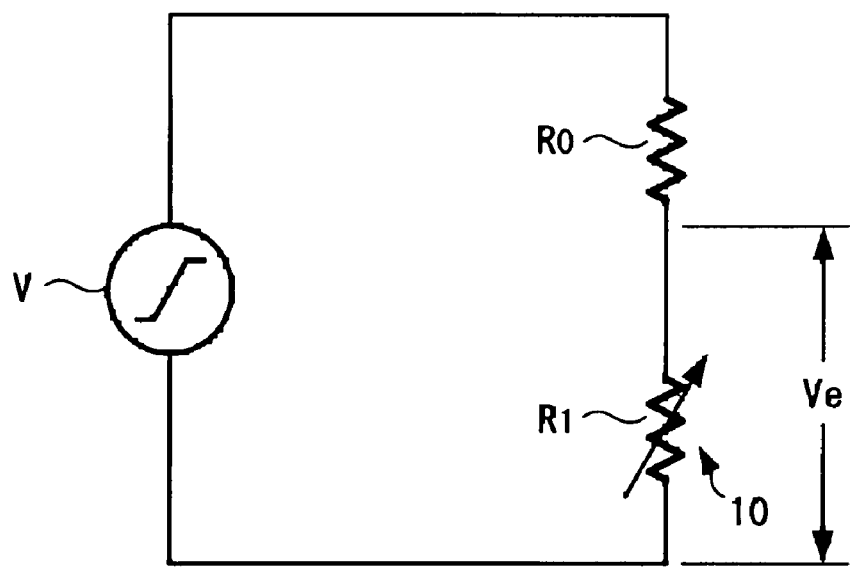
FIG. 2 is a diagram showing an equivalent circuit.

FIG. 2 shows an equivalent circuit of the memory element 10. In the equivalent circuit of FIG. 2, a voltage V is applied to a structure in which an external load resistance R0 is connected in series to the memory element 10. Further, when the resistance value of the erased state of the memory element 10 is assumed to be R1, a voltage Ve applied to the upper and lower electrodes of the memory element 10 which is in the erased state is:

$$Ve = V \cdot R1/(R0+R1) \qquad (1)$$

Further, when R1 has the voltage dependence on the voltage V and the resistance R1 of the erased state becomes small as the applied voltage V increases, Ve does not increase in proportion to V but Ve becomes small by the amount of an decrease of R1.

Therefore, in a memory element having a structure in which the resistance value R1 of the erased state is not dependent on the applied voltage V when, for example, the amplitude of the erasure voltage pulse fluctuates greatly, the voltage Ve applied to the upper and lower electrodes of the memory element 10 also fluctuates almost proportionally to a fluctuated extent, however, in the memory element 10 having a characteristic that the resistance value R1 of the erased state is dependent on the applied voltage V as described above, the fluctuation of the voltage Ve applied to the both ends of the memory element 10 becomes smaller than the fluctuated amount of the erasure pulse voltage.

Thus, since the fluctuation (increase) of the resistance value of the memory element 10 at the end of the erasing process can be controlled with the decrease in the fluctuation of the applied voltage Ve, the fluctuation of the threshold voltage in the next recording process after erasure can be controlled, and the recording and erasure can be performed stably.

In order for the resistance value of the memory element 10 to have such erasure voltage dependence as described above, it can be considered to use an effect of a tunnel current that is generated when the insulation film constituting the memory layer 4 is extremely thin, and to generate a similar phenomenon to the tunnel current in a portion of the current path generated by the movement of the ion or in other portion where no current path is generated, when there are a large number of defects in the insulation film that constitutes the memory layer 4 and an electric current flows through the defects.

Therefore, in order to set the resistance value, since there is also a contribution of an area of the portion where the current path is not generated in the memory layer 4, an electrical resistivity of high resistance material used for the memory layer 4 is appropriately selected in accordance with a size of a cell.

Note that typically the memory layer 4 is the high resistance in the initial state before recording, however, may be the low resistance of the recorded state in the initial state by means of a plasma treatment, annealing treatment, and the like in the process.

According to the above-described memory element 10 of this embodiment, with the film thickness of the memory layer 4 being made thin, for example, the fluctuation (increase) of the resistance value of the memory element 10 at the end of the erasing process of changing from the recorded state to the erased state due to the increase of the applied voltage (erasure voltage) can be controlled within ten times at a maximum.

Further, since the fluctuation (increase) of the resistance value of the memory element 10 at the end of the erasing process of shifting from the recorded state to the erased state due to the increase of the applied voltage (erasure voltage) is within ten times at a maximum, the fluctuation of the resistance-voltage characteristic in the erased state (high resistance state) can be controlled, and accordingly the fluctuation of the threshold voltage of the next recording process can be controlled.

In addition, since the erasing process is completed almost securely to shift into the erased state by a comparatively small voltage, the erasure can be performed easily and stably even by a small voltage and short voltage pulse. Therefore, power consumption can be reduced and higher speed operation can be performed in recording and erasure.

Accordingly, the recording and erasure of information can be performed stably in the memory element 10 of this embodiment.

Further, when the memory element 10 has a structure in which the resistance value in the high resistance state (erased state) of the memory element 10 has the voltage dependence and the resistance of the erased state decreases along with the increase of the applied voltage, the fluctuation (increase) of the resistance value of the memory element 10 at the end of the erasing process due to the increase of the erasure voltage can be controlled by means of such characteristic.

Accordingly, the fluctuation of the above-described threshold voltage of the recording process is controlled, and stable recording can be performed.

Further, when the memory element 10 has a structure in which an element (chalcogen element) selected from Te, S, and Se is contained in the ion source layer 3, the recording can be performed even by applying a comparatively low voltage, because the chalcogen element has a property of facilitating the ionization of Cu, Ag, and Zn (metal elements that become the ion source).

A memory device can be configured by disposing a large number of the memory devices 10 of the above-described embodiment in a matrix form.

A wiring connected on the side of the lower electrode 2 and a wiring connected on the side of the upper electrode 6 are provided with respect to each memory element 10, and each memory element 10 may be disposed in the vicinity of a cross-point of those two wirings, for example.

Specifically, the lower electrode 2 is formed in common with respect to memory cells in a row direction and the wiring connected to the upper electrode 6 is formed in common with respect to memory cells in a column direction, for example, the lower electrode 2 and wiring to which an electric potential is applied to flow an electric current are selected so that a memory cell to which the recording should be performed is selected, and the recording of information and erasure of recorded information can be performed by flowing the electric current in the memory element 10 of this memory cell.

Further, the memory element 10 of the above-described embodiment can stably perform the recording and erasure of information.

Moreover, in the memory element 10 of the above-described embodiment, the recording of information and retention of recorded information becomes easy even when the memory element 10 is made minute.

Therefore, by forming the memory device using the memory element 10 of the above-described embodiment, an integration (higher density) and miniaturization of a memory device can be obtained.

Although the memory element 10 is made by forming respective thin films of the ion source layer 3 and memory layer 4 in the above-described embodiment, the present invention can be applied to other structures than the above.

For example, a structure in which the metal elements (Cu, Ag, and Zn) that become the ion source are contained not only in the ion source layer but also in the memory layer, a structure in which the memory layer also functions as the ion source layer and metal elements that become the ion source are contained in the memory layer, a structure in which the ion source layer and memory layer are integrated to have a composition distribution (a portion containing a large amount of metal elements that become the ion source, a portion containing a small amount thereof, and the like), and so forth can be considered.

PRACTICE EXAMPLE

Next, a memory element according to the present invention is actually produced, and the characteristic thereof is examined.

Experiment 1

Comparison Example

First, a memory element in which the film thickness of the memory layer 4 was made comparatively thick in the memory element 10 having a cross-sectional structure shown in FIG. 1 was produced as a sample of a memory element of a comparison example to the memory element of the embodiment of the present invention.

Specifically, a TiW film was formed as the lower electrode 2, a CuTeGe film having a film thickness of 20 nm was formed as the ion source layer 3, and a GdGe oxide film having a film thickness of 5 nm was formed as the memory layer 4. Further, the insulation layer 5 was formed on the memory layer 4, and an opening (through-hole) was formed in the insulation layer 5. The size of this opening was made into about 0.7 μmφ.

Thereafter, an Au film was formed as the upper electrode 6 connecting to the memory layer 4 through the opening, and the memory element 10 shown in FIG. 1 was produced to be the sample of the memory element of the comparison example.

The lower electrode 2 and upper electrode 6 were connected respectively to an electric potential with respect to the sample of the memory element of this comparison example, a voltage applied between the lower electrode 2 and the upper electrode 6 was set such that a maximum voltage value was −1.4V at the time of recording and a maximum voltage value was +1.4V at the time of erasure, and an electric current was measured by sweeping the voltage repeatedly between those voltages. Also, a resistance value was calculated from each value of the voltage and current.

Figure 3A:
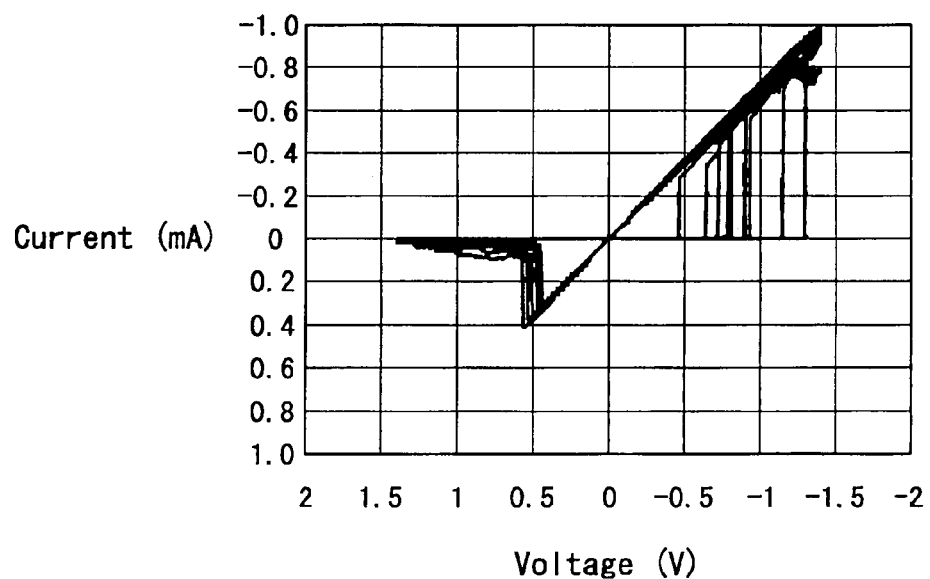
FIG. 3A is a diagram showing a current-voltage characteristic of a sample of a memory element according to a comparison example.
Figure 3B:
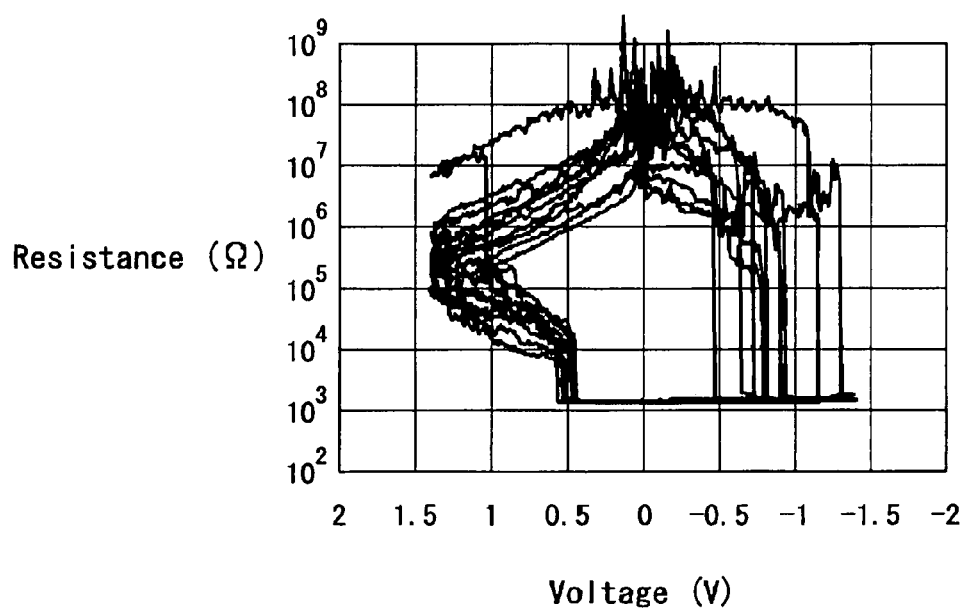
FIG. 3B is a resistance-voltage characteristic of the sample of the memory element of the comparison example.

As a measurement result, a current-voltage characteristic is shown in FIG. 3A, and a resistance-voltage characteristic is shown in FIG. 3B.

As seen from FIGS. 3A and 3B, a threshold voltage of the erasure is approximately +0.5V and a fluctuation is small, but a threshold voltage of the recording fluctuates approximately from −0.5V to −1.3V.

Specifically, even when the same voltage is applied repeatedly, the threshold voltage of the recording fluctuates and it is difficult to make a memory operation stable.

Fluctuation of the threshold voltage of the recording is thus caused greatly, because the threshold value of the next recording is determined depending on the position where Cu ions have returned to when the Cu ions move by the erasure as described above.

For example, in the case where all the Cu ions have returned to the ion source layer 3, it is necessary that an electric field required for recording is applied to the extent of an effective thickness of the memory layer 4 (5 nm, in this sample) in the next recording process, and a voltage of approximately 1.3 to 1.5V, specifically, an electric field intensity of approximately 0.26 to 0.3V/nm, becomes necessary.

On the other hand, in the case where the Cu ions have returned only up to approximately middle of the memory layer 4, for example, the threshold voltage of the next recording process is thought to be approximately 0.65 to 0.75V, because similarly the required electric field intensity becomes approximately 0.26 to 0.3V/nm.

Thus, when the film thickness of the memory layer 4 whose resistance value changes along with the movement of the atom (ionic movement) is approximately 5 nm or more, the threshold voltage of the next recording fluctuates greatly depending on the erased state, and it becomes difficult to obtain a stable recording operation.

In addition, as seen from FIG. 3B, the change of the resistance value is not uniform but has dispersion in the erasing process. Further, when an erasure voltage equal to or more than the threshold voltage for the erasure is applied in the erasing process, the resistance value of the memory element also increases along with the increase of the erasure voltage, and it is shown that the resistance value increases in a range of about 30 times to 100 times or more, when the erasure voltage increases from +0.5V to +1.4V. In this case, the resistance value of the memory element 10 at the end of the erasing process increases (fluctuates) along with the increase of the erasure voltage. Note that the resistance value of the memory element 10 at the end of the erasing process is thought to increase (fluctuate) until saturation at some level when the applied voltage is made larger than +1.4V.

Thus, when the resistance value of the memory element 10 at the end of the erasing process fluctuates along with the increase of the erasure voltage, the resistance value of the memory element 10 at the end of the erasing process fluctuates to result in dispersion in the resistance value of the erased state when the erasure voltage varies. FIG. 3B shows that the resistance value in a state where the voltage is not applied (voltage 0) is approximately $5 \times 10^6 \Omega$ to $5 \times 10^9 \Omega$, which varies largely. Further, the threshold voltage of the next recording process also varies due to the dispersion of the erased state, as described above.

Here, since the sample of this comparison example shows a characteristic that the resistance value of the memory element 10 in the erased state decreases along with the increase of the applied voltage (slope down to the left in FIG. 3B), the resistance value increases only up to a smaller resistance value than the maximum value of the resistance value at the time when the voltage is 0, as seen from FIG. 3B.

On the other hand, when the characteristic is such that the resistance value of the memory element 10 in the erased state does not decrease even if the applied voltage increases, the resistance value increases to the vicinity of the maximum value (almost equivalent to the maximum value of the resistance value at the time without voltage) of the resistance value of the memory element 10.

Experiment 2

Practice Example 1 and Practice Example 2

Next, the memory element 10 shown in FIG. 1 was produced to make a sample of the memory element 10 of a practice example 1, in which a CuTeGeGd film having a film thickness of 20 nm was formed as the ion source layer 3, a Gd oxide film having a film thickness of 3 nm was formed as the memory layer 4, a TiW film was formed as the upper electrode 6, and those other than that were made similar to the experiment 1 (sample of the comparison example).

Further, the memory element 10 shown in FIG. 1 was produced to make a sample of the memory element 10 of an practice example 2, in which the film thickness of the Gd oxide film of the memory layer 4 was made into 1.4 nm, and the other structure than that was made similar to the sample of the practice example 1.

Similarly to the experiment 1 except for a change in the range of the applied voltage, an electric current was measured by sweeping a voltage repeatedly with respect to each sample of the memory elements 10 of the practice example 1 and practice example 2. In addition, a resistance value was calculated from each value of the voltage and current. The applied voltage was set from −2V to +2V for the sample of the practice example 1 and from −1.5V to +1.2V for the sample of the practice example 2.

Figure 4A:
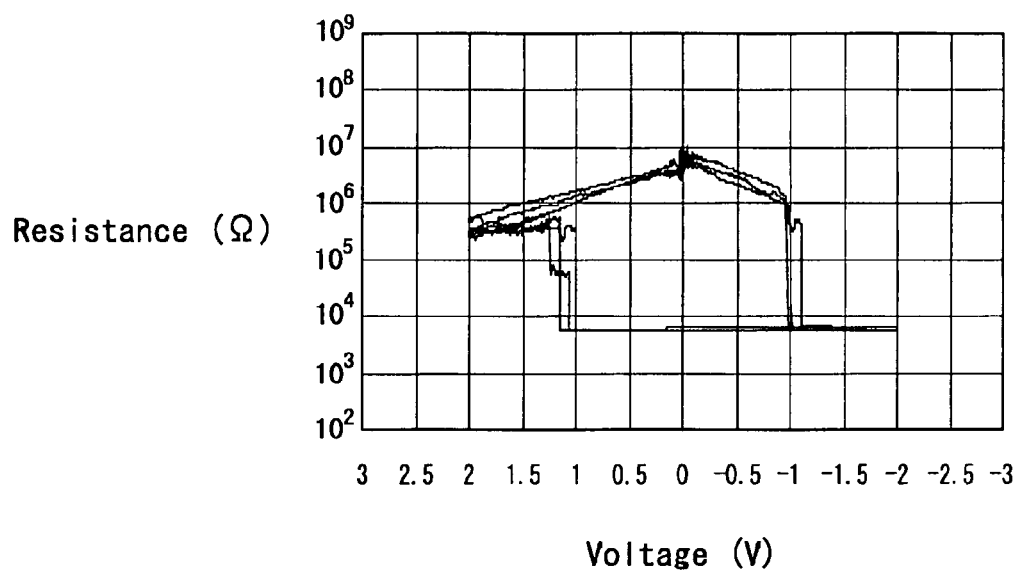
FIG. 4A is a diagram showing a resistance-voltage characteristic of a sample of a memory element according to a practice example 1.
Figure 4B:
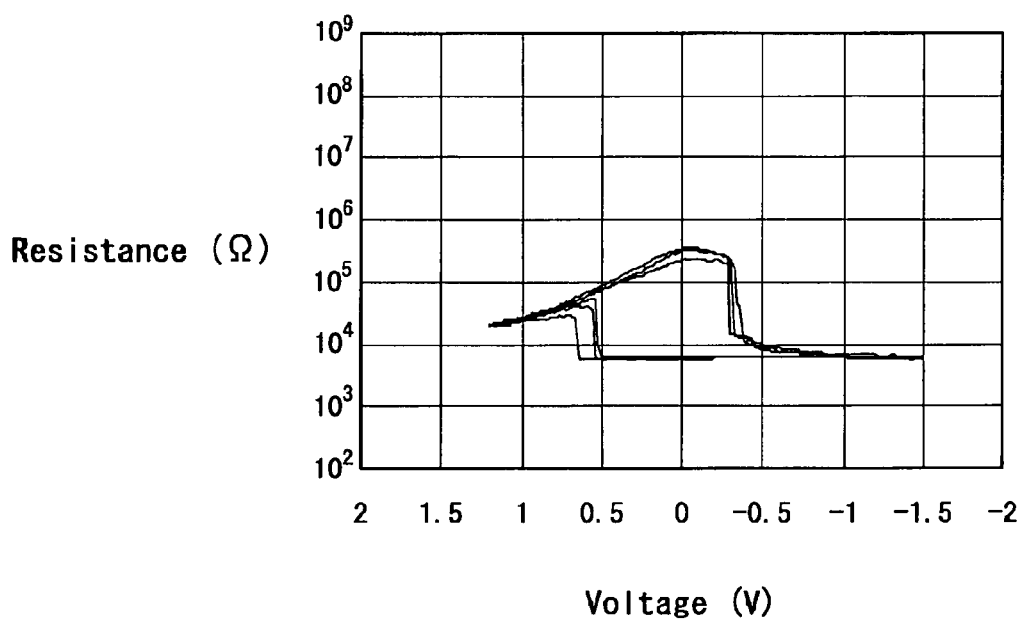
FIG. 4B is a resistance-voltage characteristic of a sample of a memory element according to a practice example 2.

As measurement results, a resistance-voltage characteristic of the sample of the practice example 1 is shown in FIG. 4A, and a resistance-voltage characteristic of the sample of the practice example 2 is shown in FIG. 4B.

FIGS. 4A and 4B show that the fluctuation of the threshold voltage in the recording process can be controlled within 0.1V by making the film thickness of the memory layer 4 comparatively thin into 3 nm or less.

Further, it can be seen that the fluctuation of the resistance value of the memory element 10 at the end of the erasing process becomes approximately 4 to 5 times and is controlled within 10 times.

Here, the resistivity of the memory layer 4 of the memory element 10 in the practice example 1 is $4\times10^6$ ($\Omega$cm), and the resistivity of the memory layer of the memory element 10 in the practice example 2 is $4\times10^4$ ($\Omega$cm).

Furthermore, as a result of measurement by producing further samples, when the film thickness of the memory layer 4 is further made thin, it is confirmed that an excellent recording threshold value characteristic similar to FIG. 4B can be obtained up to a thickness of approximately 0.5 nm, although a resistance level of the erased state becomes low.

Figure 5A:
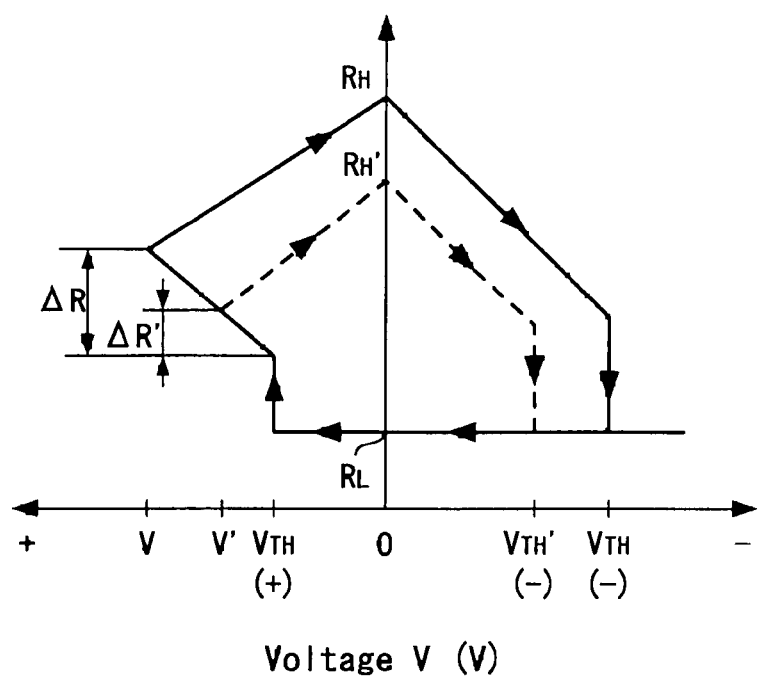
FIG. 5A is a schematic diagram of a resistance-voltage characteristic of a memory element according to a comparison example.
Figure 5B:
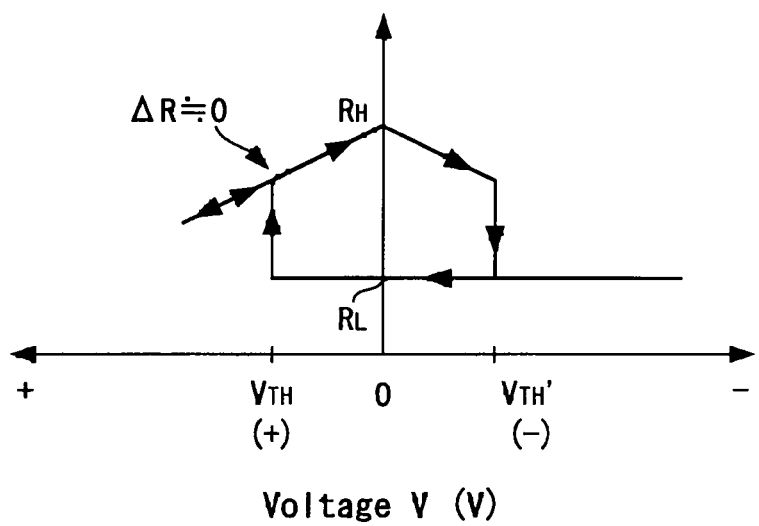
FIG. 5B is a schematic diagram of a resistance-voltage characteristic of a memory element according to the structure of an embodiment of the present invention.

Hereupon, a difference between the structure of the comparison example and the structure of the embodiment of the present invention is explained by using schematic resistance-voltage characteristic diagrams of FIGS. 5A and 5B.

FIG. 5A shows a resistance-voltage characteristic of the memory element of the comparison example.

A clockwise cycle is repeated as shown with an arrow mark in the drawing.

A solid line shows a cycle when the erasure voltage is a comparatively large voltage V.

First, when an erasure voltage larger than a threshold voltage $V_{TH}$ (+) for the erasure is applied to the memory element, the resistance value of the memory element increases from a recorded state $R_L$ of the low resistance. Then, the resistance value increases greatly by a slight increase of the voltage.

Further, when the erasure voltage applied to the memory element is further increased, since the resistance value of the memory element increases accordingly, a trajectory of sloping upward to the left is shown. The erasing process ends at a point of time when reaching a predetermined erasure voltage V, and a resistance value of the memory element has increased by as large as ΔR due to the increase of the erasure voltage.

In the structure of this comparison example, since the resistance value of the memory element of the erased state has the dependence on the voltage applied, the resistance value increases when the applied voltage is reduced and a trajectory of sloping upward to the right is shown. Further, the maximum value $R_H$ of the resistance value is shown when the voltage becomes 0.

When the resistance value of the memory element in the erased stated has the dependence on the voltage applied, a trajectory of sloping downward to the right is shown even at the time of reversing a polarity of the voltage, because the resistance value of the memory element decreases along with the increase of the applied voltage.

Further, when the applied voltage increases to reach a threshold voltage $V_{TH}$ (−) of the recording, the resistance value of the memory element rapidly decreases, because a current path by an ion is formed in the memory layer. With this, the memory element becomes a recorded state (low resistance state).

Note that almost no change of the resistance value of the memory element due to the applied voltage is shown in the recorded state and the resistance value is almost the same as the resistance value $R_L$ at the time that the voltage is 0.

On the other hand, a broken line shows a cycle when the erasure voltage is a comparatively small voltage V'.

Since the erasing process ends at a point of time reaching a predetermined erasure voltage V' and since an increase ΔR' of the resistance value of the memory element due to an increase of the erasure voltage becomes small and the memory element becomes the erased state from that point of time, a trajectory of sloping upward to the right differs from the solid line. Accordingly, a maximum value $R_H'$ of the resistance value at the time that the voltage becomes 0 also becomes small.

The following trajectory of sloping downward to the right is also different from the solid line.

Further, since the resistance value at the time of starting the recording is nearly the same order, the recording is started with a lower voltage than the solid line, and a threshold voltage $V_{TH}'$ (−) of the recording in this case becomes smaller than the solid line.

The cycle becomes almost the same as that of the solid line in the recorded state.

As shown in FIG. 5A, in the memory element having the characteristic that the increase ΔR of the resistance value due to the increase of the erasure voltage is large, since an amount of increase in the resistance value changes greatly due to the fluctuation (dispersion) of the erasure voltage, the threshold voltage of recording changes and it is difficult to perform stable recording and erasure.

FIG. 5B shows a resistance-voltage characteristic of the memory element according to the structure of the embodiment of the present invention.

A clockwise cycle is repeated as shown with an arrow mark in the drawing.

The increase of the resistance value due to the increase of the erasure voltage is made within ten times at a maximum in the present invention, and a case in which there is almost no increase ΔR of the resistance value is schematically shown in this FIG. 5B.

First, when a larger erasure voltage than the threshold voltage $V_{TH}$ (+) for the erasure is applied to the memory element, the resistance value of the memory element increases from the recorded state $R_L$ of the low resistance. Further, the resistance value greatly increases by a slight increase of the voltage.

In this memory element, the resistance value of the memory element does not increase even when the voltage applied to the memory element is increased, and a trajectory of sloping upward to the left is not shown. Due to the above, the erasing process ends at this point of time, and the memory element shifts into the erased state. Here, it is conceivable that a trajectory of sloping upward to the left exists only a slight period of time when the increase $\Delta R$ of the resistance value due to the increase of the erasure voltage is as much as approximately several times.

When the memory element shifts into the erased state and when the applied voltage is further increased, the resistance value decreases and becomes a trajectory of sloping downward to the left, because the resistance value of the memory element of the erased state has dependence on the applied voltage as described above.

When the increase of the applied voltage stops at a predetermined voltage and the applied voltage decreases, the resistance value increases and shows a trajectory of sloping upward to the right. Further, the maximum value $R_H$ of the resistance value is shown when the voltage becomes 0.

When the resistance value of the memory element in the erased state has the dependence on applied voltage, a trajectory of sloping downward to the right is shown, because the resistance value of the memory element decreases along with the increase of the applied voltage even when the polarity of the voltage is reversed.

Further, when the applied voltage increases and reaches the threshold voltage $V_{TH}$ (−) for the recording, the resistance value of the memory element decreases abruptly, because a current path by an ion is formed in the memory element. Accordingly, the memory element becomes the recorded state (low resistance state).

Almost no change of the resistance value of the memory element due to the applied voltage is in the recorded state, and the resistance value is almost the same as the resistance value $R_L$ at the time that the voltage is 0.

When the erasure voltage is made into a comparatively small voltage for the memory element having the characteristic shown in FIG. 5B, similarly, the memory element shifts into the erased state, because there is almost no increase $\Delta R$ of the resistance value due to the increase of the erasure voltage. Further, the threshold voltage $V_{TH}$ (−) of the recording does not change, because the trajectory of sloping downward to the left only becomes short and the similar trajectory is taken thereafter.

As shown in FIG. 5B, in the memory element having the characteristic that there is almost no increase $\Delta R$ of the resistance value caused by the increase of the erasure voltage, because the erasing process ends with the comparatively small voltage to shift into the erased state, the resistance value of the erased state does not fluctuate even if there is a fluctuation (dispersion) of the erasure voltage.

In addition, even when the increase $\Delta R$ of the resistance value due to the increase of the erasure voltage is as small as approximately several times, the fluctuation of the resistance value of the erased state is controlled to be small.

Accordingly, the fluctuation of the threshold value of the recording can be controlled, and it is possible to perform stable recording and erasure.

Hence, by forming the memory element 10 such that the increase $\Delta R$ of the resistance value due to the increase of the erasure voltage is as small as within ten times at a maximum, the fluctuation of the threshold voltage of the recording can be controlled to perform the stable recording and erasure.

Experiment 3

Practice Example 3

Next, a memory element was produced by changing the material of the memory layer 4, whose electrical resistivity was low, and a characteristic was examined similarly.

The memory element 10 was produced to make a sample of the memory element 10 of a practice example 3, in which a GdW oxide film having a film thickness of 3 nm was formed as the memory layer 4, and other than that was made similarly to the sample of the experiment 2.

The resistivity of the memory layer 4 of the memory element in the practice example 3 was $1.1 \times 10^2$ ($\Omega$cm).

An electric current was measured by repeatedly sweeping a voltage for the sample of the memory element 10 of this practice example 3, while the others were similar to the experiment 1 and experiment 2. Further, a resistance value was calculated from each value of the voltage and electric current.

Figure 6A:
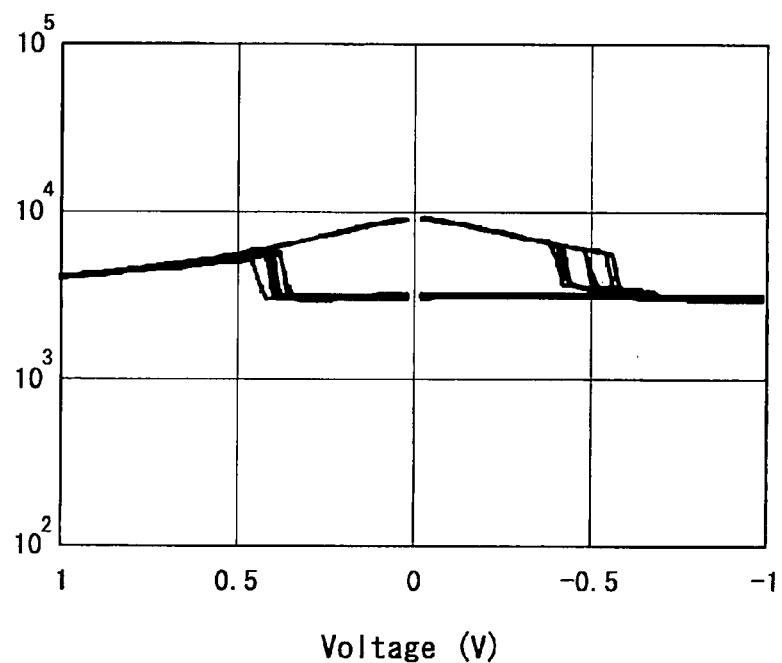
FIGS. 6A and 6B are diagrams showing resistance-voltage characteristics of a sample of a memory element according to a practice example 3.
Figure 6B:
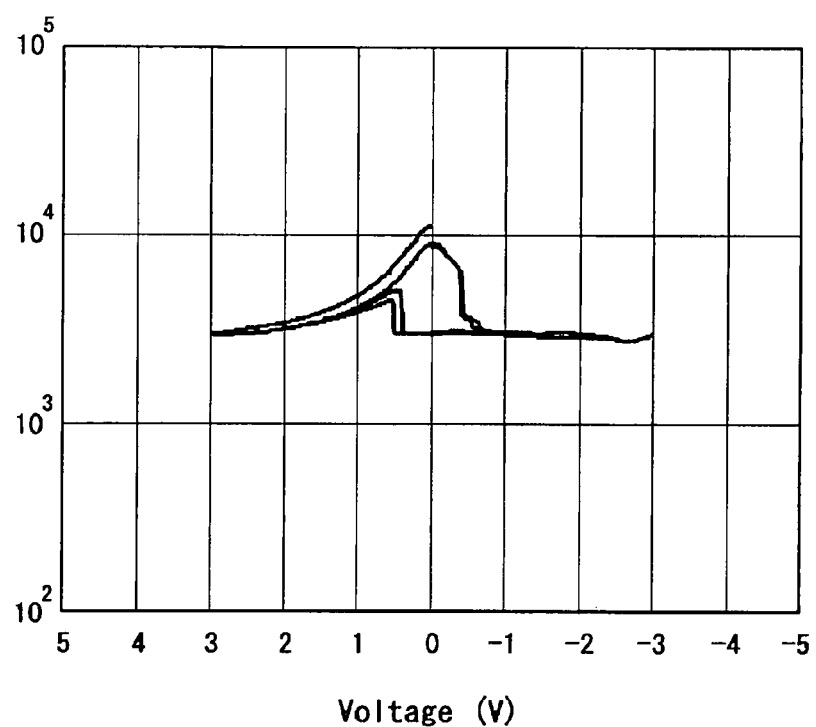

FIG. 6A shows a resistance-voltage characteristic in a case where a range of an applied voltage is set from −1V to +1V, and FIG. 6B shows a resistance-voltage characteristic in a case where the range of the applied voltage is expanded from −3V to +3V.

As seen from FIGS. 6A and 6B, in the sample of this practice example 3, the increase $\Delta R$ of the resistance value of the memory element due to the increase of the erasure voltage is considerably small, and the threshold voltage of the recording is approximately −0.4V to −0.5V, and the fluctuation of the threshold voltage is controlled to somewhere approximately 0.1V.

In addition, since the material of the memory layer 4 is changed to the one whose resistivity is low, the change of the resistance value becomes as small as three times such that the resistance value of the memory element 10 is approximately 9 k$\Omega$ at the maximum and 3 k$\Omega$ at the minimum.

Furthermore, even if the range of the applied voltage is expanded, the threshold voltage of the next recording process is almost the same level and the fluctuation of the threshold value and the dependence on the erasure voltage are extremely small.

Even if the change of the resistance value becomes as small as there times, readout (detection) of information recorded in the memory element 10 can be performed easily without a problem, because the change is large in comparison to approximately 1.5 times of a TMR element (Tunnel Magneto-Resistive Effect element) that is used for an MRAM.

The present invention is not limited to the above-described embodiments, but other various structures are also possible within a scope not deviating from the contents of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A method, comprising:
   (A) receiving, by a memory element comprising an ion path layer and an ion source layer in contact with said ion path layer, an application of a first voltage, said ion path layer being positioned between a first electrode and a second electrode, wherein an element selected from Cu, Ag, and Zn is contained in said ion path layer or in a layer in contact with said ion path layer and an element selected from Te, S and Se is contained in said ion source layer;

(B) upon application of the first voltage, said memory element providing a changed resistance to perform recording of information by said memory element, said changed resistance causing a recorded state of said memory element defined by a low resistance value, an erased state of said memory element being defined by a high resistance value; and (C) receiving, by said memory element, an application of a second voltage, the application of the second voltage causing a change in said memory element from said recorded state to said erased state, a resistance value of said memory element after the change being within ten times a resistance value of said memory element prior to said change.

2. The method of claim 1, wherein the larger the first voltage applied to said memory element is, the more a resistance value of said erased state of said memory element decreases.

3. The method of claim 1, wherein an element selected from Te, S, and Se is contained in said ion path layer.

4. The method of claim 1, wherein the acts (A), (B) and (C) are performed by a plurality of memory elements.

* * * * *